United States Patent
Tchaplia

(10) Patent No.: US 8,422,122 B2
(45) Date of Patent: Apr. 16, 2013

(54) SPLITTER/COMBINER AND WAVEGUIDE AMPLIFIER INCORPORATING SPLITTER/COMBINER

(76) Inventor: Ilya Tchaplia, Concord (CA)

(*) Notice: Subject to any disclaimer, the term of this patent is extended or adjusted under 35 U.S.C. 154(b) by 204 days.

(21) Appl. No.: 12/713,341

(22) Filed: Feb. 26, 2010

(65) Prior Publication Data
US 2010/0177379 A1 Jul. 15, 2010

Related U.S. Application Data

(63) Continuation of application No. PCT/CA2008/001523, filed on Aug. 29, 2008.

(60) Provisional application No. 60/968,833, filed on Aug. 29, 2007.

(51) Int. Cl.
*H01S 3/00* (2006.01)

(52) U.S. Cl.
USPC .......................... 359/342; 333/121; 333/125

(58) Field of Classification Search .................. 333/125, 333/121; 359/342
See application file for complete search history.

(56) References Cited

U.S. PATENT DOCUMENTS

| | | | |
|---|---|---|---|
| 2,848,689 A | 8/1958 | Zaleski | |
| 3,775,694 A | 11/1973 | Quine | |
| 4,234,854 A | 11/1980 | Schellenberg et al. | |
| 4,282,492 A | 8/1981 | MacMaster et al. | |
| 4,283,685 A | 8/1981 | MacMaster et al. | |
| 4,424,496 A | 1/1984 | Nichols et al. | |
| 4,477,781 A * | 10/1984 | Reuss, Jr. | 330/286 |
| 4,588,962 A | 5/1986 | Saito et al. | |
| 4,590,446 A | 5/1986 | Hsu et al. | |
| 4,677,393 A | 6/1987 | Sharma | |
| 5,214,394 A | 5/1993 | Wong | |
| 5,256,988 A | 10/1993 | Izadian | |
| 5,363,464 A * | 11/1994 | Way et al. | 385/125 |
| 5,532,661 A * | 7/1996 | Lagerlof | 333/125 |
| 5,838,201 A | 11/1998 | Sechi | |
| 6,160,454 A * | 12/2000 | Buer et al. | 330/295 |
| 6,646,504 B2 | 11/2003 | Dittmer et al. | |
| 6,762,653 B2 * | 7/2004 | Adlerstein et al. | 333/125 |
| 6,982,613 B2 | 1/2006 | Wu et al. | |
| 7,176,762 B2 | 2/2007 | Johnson | |
| 7,952,434 B2 * | 5/2011 | Shimizu et al. | 330/307 |
| 2002/0084852 A1 | 7/2002 | Cook et al. | |
| 2004/0041658 A1 | 3/2004 | Alderstein et al. | |
| 2004/0090271 A1 | 5/2004 | Sung et al. | |

FOREIGN PATENT DOCUMENTS

| | | |
|---|---|---|
| EP | 0677885 A1 | 10/1995 |
| JP | 2005266478 A | 9/2005 |
| WO | 9717720 A2 | 5/1997 |
| WO | 0024081 A1 | 4/2000 |

OTHER PUBLICATIONS

European Search Report dated Oct. 6, 2011; as issued in European Patent Application No. 08800250.6.
International Preliminary Report on Patentability dated Mar. 11, 2010 in regards to International Application No. PCT/CA2008/001523, received Mar. 25, 2010.

* cited by examiner

*Primary Examiner* — Mark Hellner
(74) *Attorney, Agent, or Firm* — Bereskin & Parr LLP/S.E.N.C.R.L., s.r.l.

(57) ABSTRACT

Several embodiments of waveguide amplifiers incorporating a network of waveguides, signal splitters, solid state amplifiers and signal combiners are disclosed. The signal splitters and combiners have similar structures including parallel input and exit ports. In some embodiments, the solid state amplifiers are enclosed within the waveguide amplifier.

25 Claims, 4 Drawing Sheets

SPLITTER/COMBINER AND WAVEGUIDE AMPLIFIER INCORPORATING SPLITTER/COMBINER

FIELD

The embodiments described herein relate to high frequency signals. More particularly, these embodiments relate to splitters, combiners and waveguides for high frequency signals.

BACKGROUND

Growing demand in today's market for bandwidth, increased data rates, and satellite communications mobility has led to increasing use of high frequency radio frequency bands for satellite communications. This has resulted in a corresponding need for communication system components that function at these high frequencies. In many cases, these communication systems operate in the microwave frequency range, between 300 MHz and 300 GHz.

Among the components typically required in such systems are high powered amplifiers (HPA). Some existing high frequency high power amplifiers (HPA) employ traveling wave tube amplifiers (TWTA's). These devices require high voltage power supplies. They are also susceptible to single point failure and to achieve linear operation, these devices typically operate within a narrow operational range. In addition, TWTA's tend to be large and heavy, and demonstrate poor reliability, which is not optimal for many technologies, including satellite technology.

Some HPAs are solid-state devices. In contrast to TWTA's, solid-state amplifiers are small, efficient, relatively inexpensive, and reliable. However, a limitation of solid-state amplifiers is their low power output, which is too low for satellite transmission. This limitation has often been overcome through power combining, by combining the outputs of multiple relatively low power amplifiers.

The combining and splitting stages known in the prior art have included spatial combiners and corporate combiners. In spatial combiners, power is split and combined using fields in space, according to well-known antenna technology. In corporate combiners, the splitting and combining occurs as the signals follow branching transmission line paths.

The transmission line paths used in corporate combiners of the prior art have included microstrips and waveguides. A disadvantage of using microstrips is the high losses associated with splitting and combining of a high power signal, and the limited bandwidth in which they may be used. A disadvantage of the corporate combiners of the prior art which have employed waveguides has been that the splitting and combining have occurred in "magic tee" junctions, which are bulky and expensive to manufacture.

There remains, therefore, a need for a high power amplifier that can perform at super high frequencies, that is reliable, efficient, relatively light, and inexpensive to manufacture.

SUMMARY

One embodiment of the invention provides a waveguide amplifier comprising a waveguide block and a cover. The waveguide amplifier includes: an input port; an output port; and a network of waveguide channels, signal splitters, solid state amplifiers and signal combiners between the input port and the output port to provide, at the output port, an amplified signal corresponding to the input signal. The cover is adapted to cover at least the waveguide channels.

In some embodiments, the waveguide block includes recesses within which the solid state amplifiers are mounted within the recesses. In some embodiments, the cover also the recesses.

In some embodiments, the waveguide block is formed from single block of material.

In some embodiments, the waveguide block is formed from a block of material and wherein the waveguide channels are lined with a metal.

In some embodiments, the cover is a unitary element.

In some embodiments, some of the waveguide channels have an exit transition region, and the network includes a plurality of amplifier input signal couplers and transmission lines. Each of the amplifier input signal couplers is coupled to an exit transition region and a transmission line is coupled between the amplifier input signal coupler and one of the solid state amplifiers.

In some embodiments, some of the waveguide channels have an entry transition region. The network includes a plurality of amplifier output signal couplers and transmission lines. Each of the amplifier output signal couplers is coupled to an entry transition region and a transmission line is coupled between a solid state amplifier and the amplifier output signal coupler.

In some embodiments, at least some of the splitters have: a splitter entry port; first and second splitter exit ports; a splitter exit port barrier between the first and second splitter exit ports; a signal splitting region coupling the splitter entry port to each of the first and second splitter exit ports. The signal splitting region includes: a signal expansion region coupled to the splitter entry port; and first and second split signal regions coupled, respectively, to the first and second splitter exit ports.

In some embodiments, at least some of the combiners have: first and second combiners entry ports; a combiner exit port; an entry port barrier between the first and second combiner entry ports; and a signal combining region coupling the combiner entry ports to the combiner exit port. The signal combining region includes first and second input signal regions coupled, respectively, to the first and second combiner entry ports and a signal compression region coupled to the combiner exit port.

Another aspect of the invention provides a signal splitter comprising: a signal entry port; first and second signal exit ports; an exit port barrier between the first and second signal exit ports; a signal splitting region coupling the signal entry port to each of the first and second split signal exit ports. The signal splitting region includes a signal expansion region coupled to the signal entry port and first and second split signal regions coupled, respectively, to the first and second signal exit ports.

In some embodiments, the signal expansion region has an increasing cross-sectional width between the signal entry port and the first and second split signal regions.

In some embodiments, the E-plane cross-section of the signal expansion section increases linearly between signal entry port and the split signal regions.

In some embodiments, the signal entry port is coupled to a waveguide channel have an E dimension and an H dimension, wherein the signal entry port and each of the first and second signal exit ports have the same E and H dimensions.

In some embodiments, the first and second split signal regions each have the same H dimension as the signal entry ports and have a smaller E dimension than the signal entry port.

In some embodiments, the exit port barrier extends into the signal splitting region to separate the split signal regions.

In some embodiments, the first and second signal exit ports are parallel to the signal entry port.

In some embodiments, the signal entry port and the first and second signal exit ports have the same cross-sectional dimensions.

In some embodiments, the broad wall of the signal expansion section is generally flat and is at an angle of about 45 degrees to the broad wall of the signal entry port.

In another aspect, the present invention provides a signal combiner comprising:

first and second signal entry ports; a signal exit port; an entry port barrier between the first and second signal entry ports; a signal combining region coupling the signal entry ports to the signal exit ports. The signal combining region includes first and second input signal regions coupled, respectively, to the first and second signal entry ports and a signal compression region coupled to the signal exit port.

In some embodiments, the signal compression region has a decreasing cross-sectional width between the first and second input signal regions and the signal exit port.

In some embodiments, the E-plane cross-section of the signal compression section decreases linearly between the first and second input signal regions and the signal exit port.

In some embodiments, the signal exit port is coupled to a waveguide channel have an E dimension and an H dimension, wherein the signal entry ports and signal exit port have the same E and H dimensions.

In some embodiments, the first and second input signal regions each have the same H dimension as the signal exit port and have a smaller E dimension than the signal exit port.

In some embodiments, the exit port barrier extends into the signal combining region to separate the input signal regions.

In some embodiments, the first and second signal entry ports are parallel to the signal exit port.

In some embodiments, the signal entry ports and the signal exit port have the same cross-sectional dimensions.

In some embodiments, the broad wall of the signal compression section is generally flat and is at an angle of about 45 degrees to the broad wall of the signal exit port.

BRIEF DESCRIPTION OF THE DRAWINGS

Several example embodiments will now be described in detail with reference to the drawings, in which.

DESCRIPTION OF EXEMPLARY
EMBODIMENTS

It will be appreciated that specific details are set forth in order to provide an understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various embodiments described herein.

Figure 1:
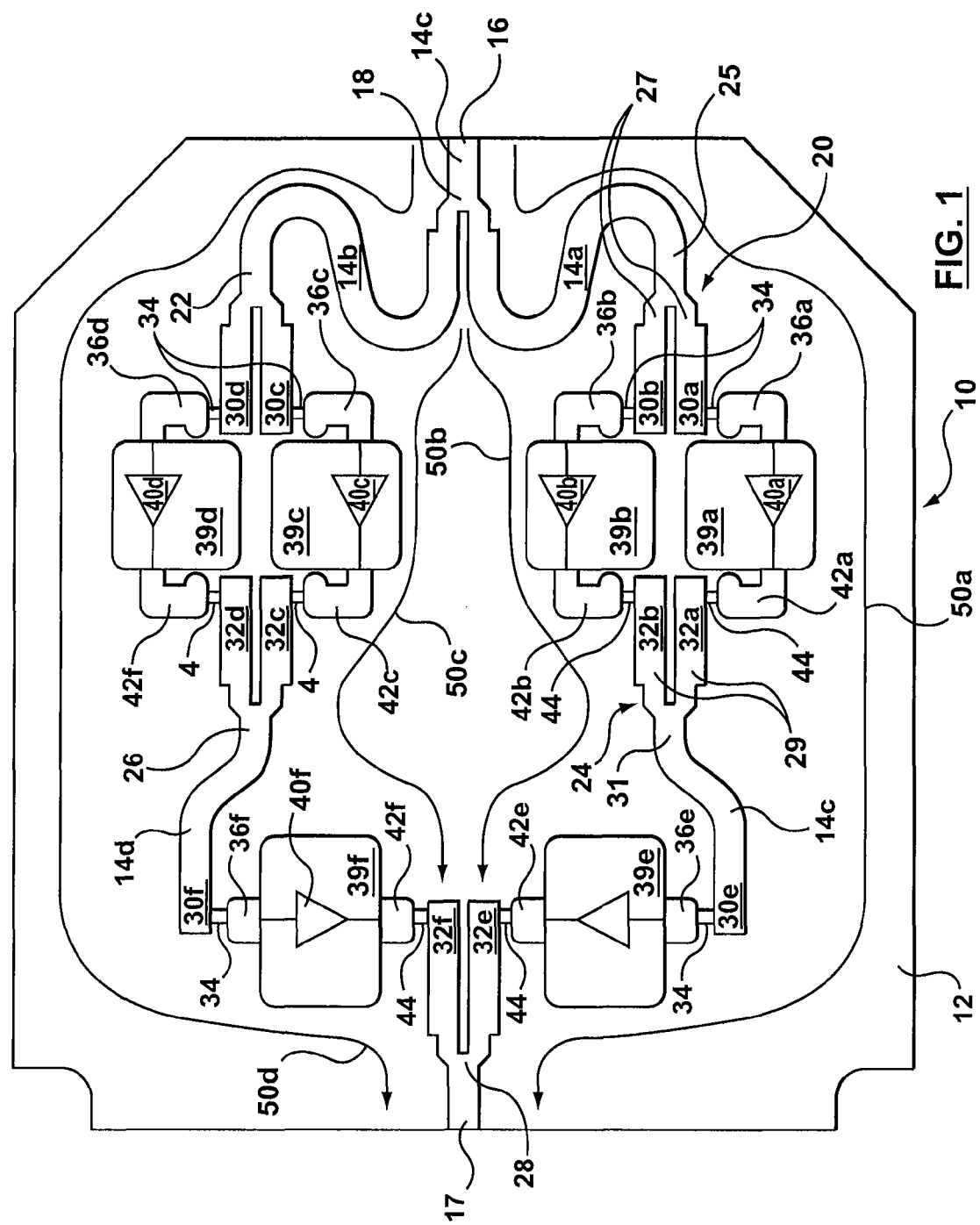
FIG. 1 is a plan view of a waveguide block of a first embodiment of a waveguide amplifier.
Figure 2:
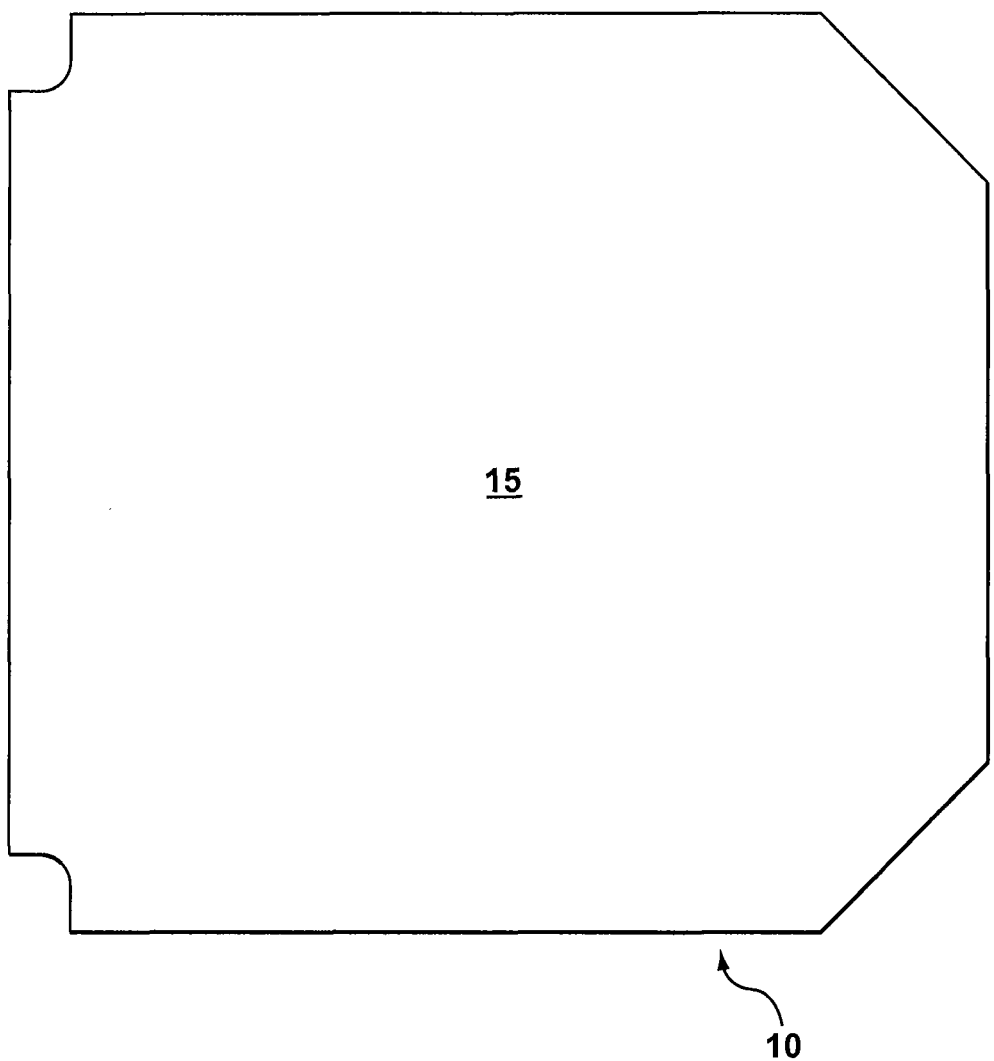
FIG. 2 is a cover of the waveguide amplifier of FIG. 1.

Reference is first made to FIGS. 1 and 2, which illustrate an exemplary waveguide amplifier 10. The waveguide amplifier 10 comprises a waveguide block 12, which is illustrated in FIG. 1, and a cover 15, which is illustrated in FIG. 2. The waveguide block 12 has the dual functions of defining a plurality of waveguide channels 14 and of housing additional components of the waveguide amplifier 10. Waveguide block 12 is formed from a single block of material, which will typically be a metal. In one embodiment, the waveguide is milled from a block of aluminum and the waveguide channels are lined or plated with gold. In some embodiments, the waveguide may formed from another material and the interior surfaces of the waveguide channels may be coated with metal.

The waveguide block 12 defines rectangular open waveguide channels 14 that are open to the top surface of the waveguide block 12. Three sides of each waveguide channel are formed in the waveguide block 12. Cover 15 is configured to fit over the open waveguide channels 14 formed in the waveguide block 12. In waveguide 10, cover 15 covers the whole of the waveguide block and has a similar outline, when viewed in a top or plan view. The cover mates closely with the waveguide channels 14 to form the fourth wall of the rectangular waveguides. Cover 15 and waveguide block 12 are coupled together using a plurality of fasteners (not shown). The cover and waveguide block may be fastened together in any manner that does not interfere with the waveguide channels 14 or the other components of the waveguide amplifier. For example, the cover and waveguide may be fastened together with screws, nuts and bolts, adhesives, by welding or by other means.

In other embodiments, the cover may have a different shape than the waveguide block. In some embodiments, the cover 15 overlaps at least the portion of the waveguide block 12 in which the various waveguides 14 are formed.

In waveguide amplifier 10, the cover 15 is a unitary element and covers the entire top surface of the waveguide block. In other embodiments, two or more covers may be provided that cover all of the waveguide channels formed in the waveguide block 12. In other embodiments, the waveguide channels may be formed partially in the waveguide block and partially in the cover. For example a part of the depth of each waveguide channel may be formed in the waveguide block and the remainder of the depth of each waveguide channel may be formed in the cover. When the cover and the waveguide block are fastened together, the waveguide channel is formed with a smooth transition between the cover and the waveguide block.

Figure 3:
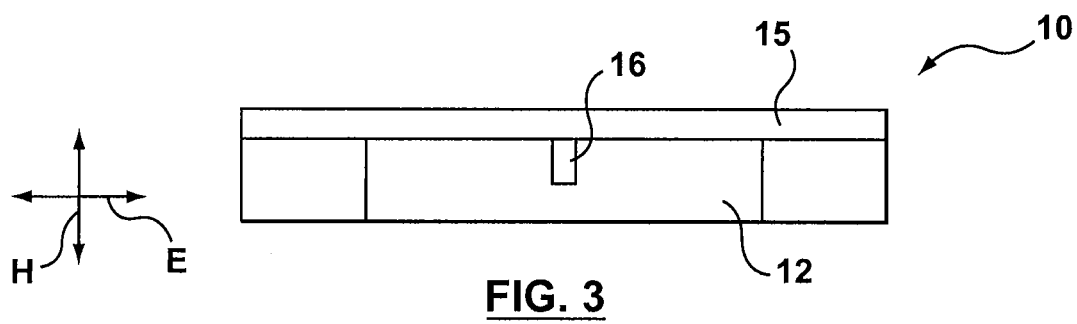
FIG. 3 is a side elevation of the waveguide amplifier of FIG. 1 illustrating an entry port.

Reference is briefly made to FIG. 3, which illustrates the cross-sectional dimensions of the input port 16 and the waveguide channel 14i. The present example waveguide amplifier 10 is adapted for use in the Ka frequency band. The waveguide channels 14 in this embodiment have an E dimension of about 0.14 inches and an H dimension of about 0.28 inches.

The dimensions of the waveguide channels 14 may be selected to transport a three-dimensional signal of a desired frequency. For example, in waveguide amplifier 10, the waveguide channels 14 have cross sectional dimensions of about 0.14 inches wide (across the face of waveguide block 14)×0.28 inches deep (into the face of waveguide block 14). A waveguide amplifier having waveguide channels with these dimensions is operable to amplify signals have frequencies in the range of 30 GHz. In other embodiments, the waveguide channels may have dimensions suitable for the frequency of the signals to be transmitted.

Entry port 16 provides an entrance point for an input signal to the waveguide channel 14*i*. Typically, the input signal is received from an external system or device. The input signal is amplified within the waveguide amplifier 10 to provide an output signal in waveguide channel 14*o*. An exit port 17 is formed in waveguide block to provide an exit point for the output signal to be transmitted to another system or device.

Waveguide amplifier 10 includes a plurality of signal splitters 18, 20 and 22. Each signal splitter has a splitter signal entry port 25 that branches into a pair of splitter signal exit ports 27.

Waveguide amplifier 10 also includes a plurality of signal combiners 24, 26 and 28. Each signal combiner has a pair of combiner entry ports 29 that combine into a single combiner exit port 31.

The waveguide channels 14 further comprise a plurality of waveguide exit transition regions 30. Each of the waveguide exit transition regions 30 is adjacent to a termination of a waveguide channel and is coupled to an entry transmission line 36 through an amplifier input signal coupler 34. Each signal coupler 34 converts a three-dimensional signal in the corresponding exit transition region into a corresponding planar signal in the corresponding transmission line 36.

A plurality of amplifier recesses 39 are formed in the waveguide block 12. A solid state amplifier 40 is mounted in each of the recesses. The cover 15 (FIG. 2) of the waveguide amplifier 10 covers each of the recesses 39 such that the solid state amplifiers are enclosed within the waveguide amplifier. Each entry transmission line 36 is coupled to a solid state amplifier 40 that receives a signal from the entry transmission line 36 and provides a corresponding amplified signal on an exit transmission line 42. Each exit transmission line 42 is coupled to a waveguide entry transition region 32 through an amplifier output signal coupler 44.

In this example embodiment, each transmission line 36 or 42 is a microstrip. In other embodiments, other types of transmission lines, such as wireline, coplanar waveguide or any other type of planar transmission line, may be used.

In this example embodiment, each signal coupler 34 or 44 is a pin junction. Each signal coupler 34 includes a pin that extends into the corresponding waveguide exit transition regions 30. The pin effectively acts as an antenna and receives the three-dimensional signal traveling in the waveguide. The pin is coupled to the corresponding transmission line and generates the corresponding planar signal in the transmission line 36. Similarly, each signal coupler 44 is a pin junction that is coupled to the corresponding exit transmission line 42 to receive a planar signal and to generate a corresponding three-dimensional signal in the corresponding waveguide entry transition region 32.

In operation, a three-dimensional signal is introduced into the waveguide amplifier 10 through the entry port 16 into waveguide channel 14*i*. The three-dimensional signal travels into signal splitter 18, where it is split into two corresponding three-dimensional signals in waveguide channels 14*a* and 14*b*. Each of the resulting two three-dimensional signals travels in parallel, respectively to signal splitters 20 and 22. At signal splitter 20, the three dimensional signal traveling in waveguide channel 14*a* is split into two corresponding three-dimensional signals traveling in waveguide exit transition regions 30*a* and 30*b*. Similarly, the three-dimensional signal traveling in waveguide channel 14*b* is split through signal splitter 22 into two corresponding three-dimensional signals traveling in waveguide exit transition regions 30*c* and 30*d*. At this point, the original three-dimensional signal received at entry port 16 has been split into four parallel three-dimensional signals in the waveguide exit transition regions 30*a*-30*d*.

Figure 4:
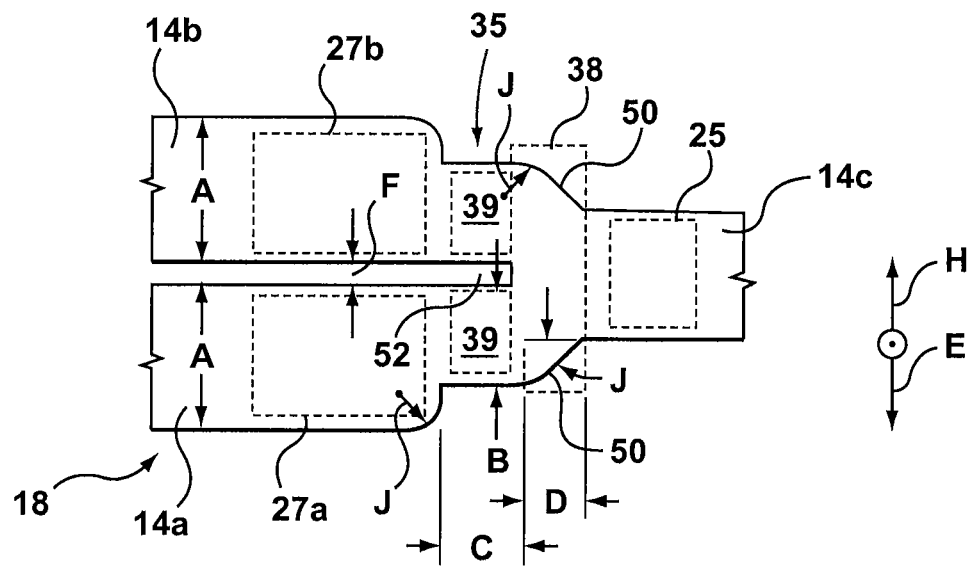
FIG. 4 illustrates a signal splitter of the waveguide amplifier of FIG. 1.

Reference is next made to FIG. 4, which illustrates signal splitter 18 in greater detail. Signal splitter 18 has a signal entry port 25 and two signal exit ports 27. The signal entry port 25 and the signal exit ports 27 are parallel to one another. The signal entry port 25 and the signal exit ports 27 have the same cross-sectional dimensions as the waveguide channels 14. The signal entry port 25 is continuous with waveguide channel 14*i* adjacent to the entry port 16. Signal exit port 27*a* is continuous with waveguide channel 14*a* and signal exit port 27*b* is continuous with waveguide channel 14*b*.

Splitter 18 includes a signal splitting region 35. Signal splitting region 35 has a signal expansion region 38 and a pair of split signal sections 39 that are formed between the signal entry port 25 and the signal exit ports 27.

The signal expansion region 38 has the same E dimension as the signal entry port 25 where the signal expansion region 38 and the signal entry port meet. As the signal expansion region extends further away from the signal entry port 25, the signal expansion port's E dimension expands. In waveguide amplifier 10, the signal expansion port's broad wall 50 (parallel to the H dimension) is flat and is angled at about 45 degrees from the broad wall 50 of the signal entry port 25.

The two signal exit ports 27*a* and 27*b* are separated by a septum or exit port barrier 52. The barrier 52 extends between the split signal sections 39. Each of the split signal sections 39 is coupled to one of the exit ports 27.

As noted above, a waveguide amplifier according to the present invention may have waveguide channels sized appropriately for the frequency of the signals traveling in the waveguides. The splitters may be scaled for use with such waveguide channels. The following table sets out some relative dimensions of the signal splitter 18.

| Measurement | Dimension |
|---|---|
| A | 1.4x |
| B | 1x |
| C | 0.8x |
| D | 0.6x |
| F | 0.3x |
| G | Radius of 0.16x |
| J | 45° |

Dimension B corresponds to the E dimension of signal entry port 25 and the signal exit ports 27, as well as the E dimension of the waveguide channels 14. When used with a Ka band waveguide channel, which will typically have an E dimension of about 0.14 inches, the value of x is about 0.714 inches. Corners 41 of the signal exit ports 27 and corner 43 at the transition between the signal expansion region 38 and split signal regions 39 are rounded with a radius of about 0.16x.

The H dimension of the signal splitters is the same as that of the waveguide channels 14. In the present example of a Ka band waveguide amplifier, the various sections of the signal splitter have an H dimension of about 0.28 inches.

In operation of the waveguide amplifier, a three-dimensional signal enters the signal entry port 25 of the signal splitter 18. The three-dimensional signal travels through the signal expansion region 38, in which, the signal expands in the E-dimension.

The expanded signal is then split into two identical split signals as it passes into the split signal sections 38. The split signals then travel into the signal exit ports 27 as three-dimensional signals that correspond in shape to the original three-dimensional signal that entered the signal entry port 25, but with a smaller magnitude.

Signal splitters 18, 20 and 22 and waveguide channels 14a and 14b together form a signal splitting network 48 that receives a three-dimensional input signal from waveguide channel 14i and provides four substantially or generally identical three-dimensional signals in waveguide exit transition regions 30a-30d. Each of the three-dimensional signals in the waveguide exit transition regions 30a-30d corresponds to the input signal.

The three-dimensional signal provided in the waveguide exit transition region 30a is converted into a planar signal traveling in entry transmission line 36a through signal coupler 34a. The planar signal is amplified by solid-state signal amplifier 40a to provide an amplified planar signal on exit transmission line 42a. Similarly, the three-dimensional signals in each of waveguide exit transition regions 30b-30d are converted into planar signals in their corresponding entry transmission lines 36 through their respective signal couplers 34. The planar signals are amplified by their respective amplifiers 40b-40d to provide amplified planar signals in exit transmission lines 42b-42d.

The amplified planar signal in exit transmission line 36a is converted into a three-dimensional signal in waveguide entry transition region 32a through signal coupler 44a. Similarly, the amplified planar signal in exit transmission line 36b is converted into a three-dimensional signal in waveguide entry transition region 32b. The three-dimensional signals in waveguide entry transition regions 32a and 32b are combined into a single three-dimensional signal in waveguide channel through signal combiner 24.

Figure 5:
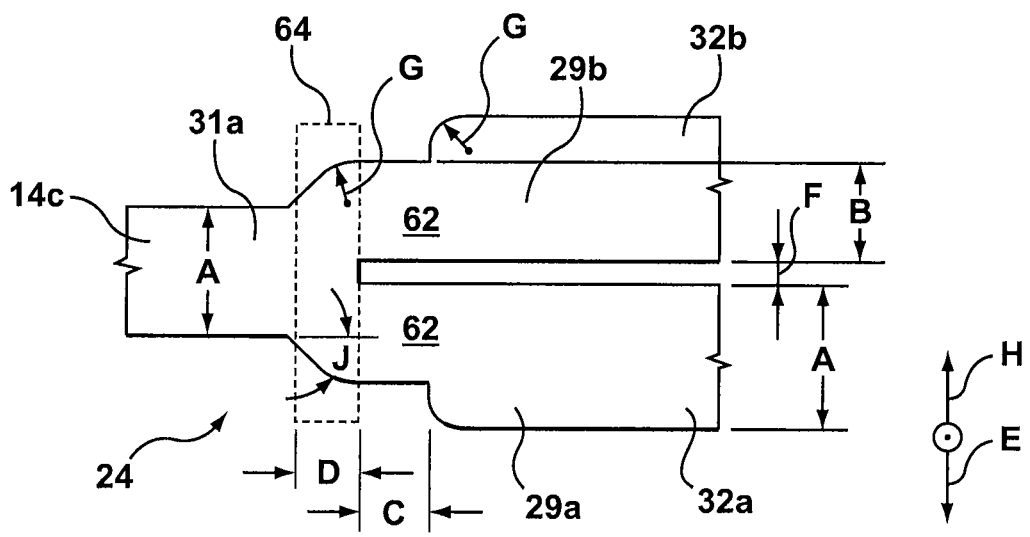
FIG. 5 illustrates a signal computer of the waveguide amplifier of FIG. 1.

Reference is next made to FIG. 5, which illustrates signal combiner 24 in greater detail. Signal combiner 24 has a pair of combiner entry ports 29, a signal combining region 60 and a signal combiner exit port 31. The combiner entry ports 29 and the exit port 31 are parallel to one another. Signal combiner 24 has essentially the same physical structure as signal splitter 18 but is used in reverse to combine signals. Signal combining region 60 has a pair of input signal regions 62 and a signal compression region 64.

Entry port 29a is continuous with, and has the same cross-section as, waveguide entry transition region 32a. Similarly, entry port 29b is continuous with, and has the same cross-section as, waveguide entry transition region 32b. Input signal region 62a is continuous with continuous with entry port 29a and input signal region 62b is continuous with entry port 29b. Entry ports 29a and 29b are separated by an entry port barrier 53. Entry port barrier 53 extends into the signal combiner 24 to form the input signal regions 62. Signal combining region 64 couples the input signal regions 62 to the signal combiner exit port 31. Signal combiner exit port 31a is continuous with waveguide channel 14c.

The signal compression region 64 has a progressively narrower E-dimension width as it extends from the input signal regions 62 to the signal combiner exit port 31.

The three-dimensional signals in waveguide entry transition regions 32a and 32b travel through the input signal regions 62a and 62b respectively. The three-dimensional signals then enter the signal compression region 64, where they are combined into a single three-dimensional signal that travels into the signal combiner exit port 31a.

Signal combiners 26 and 28 have the same structure and operation as signal combiner 24.

The signal combiners of waveguide amplifier 10 are essentially identical to the signal dividers of the waveguide amplifiers in their physical structure, but are used with a reverse signal flow. The dimensions set out above in relation to the signal dividers apply to signal combiners. Like the signal dividers, the signal combiners may be scaled to be used with waveguide channels of different dimensions.

Referring again to FIG. 1, the three-dimensional signal in the signal combiner exit port 31a travels through waveguide channel 14c to waveguide exit transition region 30e. The three-dimensional signal is converted into a planar signal in entry transmission line 36e through signal coupler 34e. The planar signal is then amplified through amplifier 44e which provides a amplified planar signal in exit transmission line 42e. The amplified planar signal is converted into a three-dimensional signal traveling in waveguide entry transition region 32e through a signal coupler 44e.

Similarly, the amplified planar signal in exit transmission lines 36c and 36d are converted into a combined three-dimensional signal through signal couplers 44c and 44d and signal combiner 26. The combined three-dimensional signal is amplified to provide an amplified three-dimensional signal in waveguide entry transition region 32f through signal coupler 34f, amplifier 40f and signal coupler 44f.

The two three-dimensional signals provided in waveguide entry transition regions 32e and 32f are combined to provide an amplified output signal at the exit port 17.

Signals travel between in input port 16 and the exit port 17 through four paths 50a-50d in waveguide amplifier 10. It is preferable that the phase of the two signals combined in each of the combiners 24, 26 and 28 are substantially the same as one another at any time. In waveguide amplifier, the path length, including the physical dimensions, splitters and couplers, and the stewing time or delay time through the solid state amplifiers is approximately equal to ensure that the phases of the signals to be combined at each combiner are closely matched.

As noted above, the example waveguide amplifier 10 is adapted for use with Ka band frequencies. The example waveguide amplifier, and in particular the dimensions of the waveguide channels, the signal splitters and the signal combiners may be scaled to correspond to other frequency ranges or bands depending on the system in which the waveguide amplifier is to be used.

Waveguide amplifier 10 is an example implementing some aspects of the present invention. Other waveguide amplifiers according to the invention may have a different layout or arrangement. For example, if the orientation of each of the solid state amplifiers 40 is reversed, waveguide amplifier 10 could be used in the opposite direction: a three-dimensional input signal could be introduced at the exit port 17, and an amplified three-dimensional output signal could be received at the entry port 16.

Figure 6:
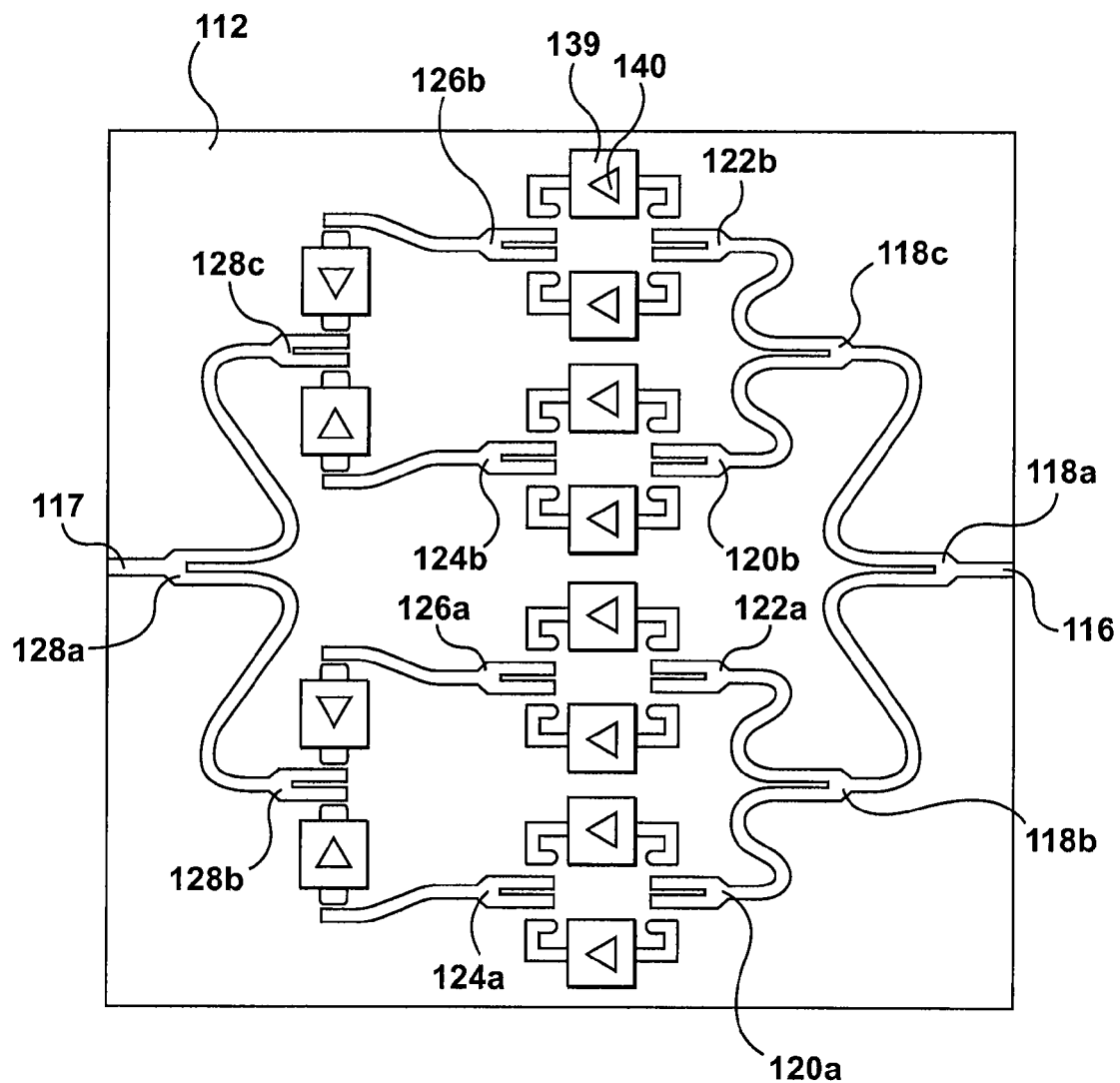
FIG. 6 is a plan view of a waveguide block of a second embodiment of a waveguide amplifier.

FIG. 6 illustrates another waveguide amplifier 110 according to the present invention. Components of waveguide amplifier 110 corresponding to waveguide amplifier 10 have generally been identified with similar reference numerals, although not all components of waveguide amplifier 110 have been labeled to avoid cluttering the drawing. Waveguide amplifier receives an input signal at input port 116 and provides an amplified output signal at output port 117. The input signal is split by a splitter 118a, which provides two identical signals to splitters 118b and 118c. Between splitter 118b and combiner 128b, waveguide amplifier 110 has essentially the same structure as waveguide amplifier 10. Similarly, splitter 118c and combiner 128c, waveguide amplifier 110 has essentially the same structure as waveguide amplifier 10. A final splitter 128a combines the signals provided by splitters 128b and 128c to provide the output signal. Waveguide amplifier 110 provides a more amplified output signal at its exit port 117, assuming that the amplifiers and other components and the corresponding path lengths are the same, subject to signal losses in splitter 118a and 128a. For example, if:

- the signal amplification between the signal entry port 125 of splitter 118b and the exit port 131 of combiner 128b is 12 dB;
- the signal amplification between the signal entry port 125 of splitter 118c and the exit port 131 of combiner 128c is 12 dB;
- the signal loss through each path in splitter 118a is 3 dB; and
- the signal loss through each path in combiner 128a is 3 dB, then the total amplification through waveguide amplifier 110 will be 18 dB.

In waveguide amplifier 110, increased output power or amplification is obtained by using an increased number of solid state amplifiers in series. The number of amplifiers can be increase to higher powers of 2 by adding additional splitting and combining stages before and after the parallel amplifiers.

Reference is again made to FIG. 1. In other embodiments, amplifiers may be added in series to provide increased signal gain. For example, one or more solid state amplifier could be added in series with some or all of the solid state amplifiers, as long as the path length of different signal paths between the entry port 16 and exit port 17 remains equal. For example, if an amplifier is added in series with amplifier 40a, then a similar amplifier must be added in series with amplifier 40b-40d.

If, in another embodiment, less gain is required, amplifiers may be eliminated, as long as the different path lengths between the entry port 16 and the exit port 17 remain equal. For example, amplifier 40e and 40f may be eliminated and the signals if waveguide channels 14c and 14d may be combined in combiner 44.

The present invention has been described here by way of example only. Many other configurations of waveguide amplifiers incorporating the features of the present invention may be assembled and all such configurations fall within the scope of the invention, which is limited only by the appended claims.

I claim:

1. A waveguide amplifier comprising:
   (a) a waveguide block including:
      an input port;
      an output port; and
      a network of waveguide channels, signal splitters, solid state amplifiers and signal combiners between the input port and the output port to provide, at the output port, an amplified signal corresponding to the input signal, wherein the signal splitters include a signal expansion region and the signal combiners include a signal compression region; and
   (b) a cover for covering the waveguide channels.

2. The waveguide amplifier of claim 1 wherein the waveguide block includes recesses and wherein the solid state amplifiers are mounted within the recesses and wherein the cover also covers the recesses.

3. The waveguide amplifier of claim 1 wherein the waveguide block is formed from single block of material.

4. The waveguide amplifier of claim 1 wherein the waveguide block is formed from a block of material and wherein the waveguide channels are lined with a metal.

5. The waveguide amplifier of claim 1 wherein the cover is a unitary element.

6. The waveguide amplifier of claim 1 wherein some of the waveguide channels have an exit transition region, and wherein the network includes a plurality of amplifier input signal couplers and transmission lines, and wherein each of the amplifier input signal couplers is coupled to an exit transition region and a transmission line is coupled between the amplifier input signal coupler and a solid state amplifier.

7. The waveguide amplifier of claim 1 wherein some of the waveguide channels have an entry transition region, and wherein the network includes a plurality of amplifier output signal couplers and transmission lines, and wherein each of the amplifier output signal couplers is coupled to an entry transition region and a transmission line is coupled between a solid state amplifier and the amplifier output signal coupler.

8. The waveguide amplifier of claim 1 wherein at least some of the splitters have:
   (i) a splitter entry port;
   (ii) first and second splitter exit ports;
   (iii) a splitter exit port barrier between the first and second splitter exit ports; and
   (iv) a signal splitting region coupling the splitter entry port to each of the first and second splitter exit ports,
wherein the signal splitting region includes: the signal expansion region, the signal expansion region being coupled to the splitter entry port; and first and second split signal regions coupled, respectively, to the first and second splitter exit ports.

9. The waveguide amplifier of claim 1 wherein at least some of the combiners have:
   (i) first and second combiner entry ports;
   (ii) a combiner exit port;
   (iii) an entry port barrier between the first and second combiner entry ports; and
   (iv) a signal combining region coupling the combiner entry ports to the combiner exit port,
wherein the signal combining region includes first and second input signal regions coupled, respectively, to the first and second combiner entry ports and the signal compression region, the signal compression region being coupled to the combiner exit port.

10. The waveguide amplifier of claim 8 wherein the signal expansion region has an increasing cross-sectional width between the signal entry port and the first and second split signal regions.

11. The waveguide amplifier of claim 10 wherein the E-plane cross-section of the signal expansion section increases linearly between signal entry port and the split signal regions.

12. The waveguide amplifier of claim 8 wherein the signal entry port is coupled to a waveguide channel have an E dimension and an H dimension, wherein the signal entry port and each of the first and second signal exit ports have the same E and H dimensions.

13. The waveguide amplifier of claim 8 wherein the first and second split signal regions each have the same H dimension as the signal entry ports and have a smaller E dimension than the signal entry port.

14. The waveguide amplifier of claim 8 wherein the exit port barrier extends into the signal splitting region to separate the split signal regions.

15. The waveguide amplifier of claim 8 wherein the first and second signal exit ports are parallel to the signal entry port.

16. The waveguide amplifier of claim 8 wherein the signal entry port and the first and second signal exit ports have the same cross-sectional dimensions.

17. The waveguide amplifier of claim 8 wherein the broad wall of the signal expansion section is generally flat and is at an angle of about 45 degrees to the broad wall of the signal entry port.

18. The waveguide amplifier of claim 9 wherein the signal compression region has a decreasing cross-sectional width between the first and second input signal regions and the combiner exit port.

19. The waveguide amplifier of claim 18 wherein the E-plane cross-section of the signal compression section decreases linearly between the first and second input signal regions and the combiner exit port.

20. The waveguide amplifier of claim 9 wherein the combiner exit port is coupled to a waveguide channel have an E dimension and an H dimension, wherein the combiner entry ports and combiner exit port have the same E and H dimensions.

21. The waveguide amplifier of claim 9 wherein the first and second input signal regions each have the same H dimension as the combiner exit port and have a smaller E dimension than the combiner exit port.

22. The waveguide amplifier of claim 9 wherein the entry port barrier extends into the signal combining region to separate the input signal regions.

23. The waveguide amplifier of claim 9 wherein the first and second combiner entry ports are parallel to the combiner exit port.

24. The waveguide amplifier of claim 9 wherein the combiner entry ports and the combiner exit port have the same cross-sectional dimensions.

25. The waveguide amplifier of claim 9 wherein the broad wall of the signal compression section is generally flat and is at an angle of about 45 degrees to the broad wall of the combiner exit port.

* * * * *